United States Patent
Hioka

(10) Patent No.: US 12,156,480 B2
(45) Date of Patent: Nov. 26, 2024

(54) SEMICONDUCTOR DEVICE AND MANUFACTURING METHOD THEREOF

(71) Applicant: ABLIC Inc., Tokyo (JP)

(72) Inventor: Takaaki Hioka, Tokyo (JP)

(73) Assignee: ABLIC Inc., Nagano (JP)

( * ) Notice: Subject to any disclaimer, the term of this patent is extended or adjusted under 35 U.S.C. 154(b) by 144 days.

(21) Appl. No.: 17/695,844

(22) Filed: Mar. 16, 2022

(65) Prior Publication Data

US 2023/0026157 A1    Jan. 26, 2023

(30) Foreign Application Priority Data

Jul. 20, 2021 (JP) .................................. 2021-119221

(51) Int. Cl.
*H10N 52/00*  (2023.01)
*G01R 33/07*  (2006.01)
*H10N 52/01*  (2023.01)

(52) U.S. Cl.
CPC .......... *H10N 52/101* (2023.02); *G01R 33/077* (2013.01); *H10N 52/01* (2023.02)

(58) Field of Classification Search
CPC ...... H10N 52/101; H10N 52/01; H10N 52/80; G01R 33/077
See application file for complete search history.

(56) References Cited

U.S. PATENT DOCUMENTS

| | | |
|---|---|---|
| 2005/0230770 A1 | 10/2005 | Oohira |
| 2012/0241887 A1 | 9/2012 | Schott et al. |
| 2015/0091112 A1* | 4/2015 | Kosier ............... H10N 52/101 |
| | | 257/427 |
| 2018/0159025 A1* | 6/2018 | Hioka ............... H10N 52/101 |
| 2018/0203078 A1* | 7/2018 | Hioka ............... G01R 33/077 |
| 2019/0319068 A1 | 10/2019 | Green et al. |
| 2020/0152861 A1* | 5/2020 | Hioka ................. H10N 52/80 |

FOREIGN PATENT DOCUMENTS

| | | |
|---|---|---|
| JP | 2005333103 | 12/2005 |
| JP | 2012204836 | 10/2012 |
| JP | 2020077814 | 5/2020 |

* cited by examiner

*Primary Examiner* — Latanya N Crawford Eason
(74) *Attorney, Agent, or Firm* — JCIPRNET

(57) ABSTRACT

A semiconductor device includes a semiconductor substrate of a first conductivity type, and a vertical Hall element provided on the semiconductor substrate. The vertical Hall element includes an impurity diffusion layer of a second conductivity type and three or more electrodes. The impurity diffusion layer is provided on the semiconductor substrate and has an impurity concentration which increases as a depth increases. The three or more electrodes are provided in a straight line on a surface of the impurity diffusion layer and are composed of an impurity region of the second conductivity type having a higher concentration than the impurity diffusion layer.

5 Claims, 4 Drawing Sheets

SEMICONDUCTOR DEVICE AND MANUFACTURING METHOD THEREOF

CROSS-REFERENCE TO RELATED APPLICATION

This application claims the priority benefit of Japan application serial no. 2021-119221, filed on Jul. 20, 2021. The entirety of the above-mentioned patent application is hereby incorporated by reference herein and made a part of this specification.

BACKGROUND

Technical Field

The present invention relates to a semiconductor device and a manufacturing method thereof.

Related Art

Hall elements are used in various applications because they can be easily formed on a surface of a semiconductor substrate (which may hereinafter be simply referred to as a "substrate") and may serve as magnetic sensors for position detection and angle detection in a non-contact manner. Specifically, magnetic sensors using a horizontal Hall element which detects a magnetic field component perpendicular to the surface of the substrate are generally well known, but various magnetic sensors using a vertical Hall element which detects a magnetic field component parallel to the surface of the substrate have also been proposed.

As an example, when a magnetic field component in a direction parallel to the substrate is applied to a drive current (hereinafter, the drive current may be simply referred to as a "current") flowing in a direction perpendicular to the substrate, a vertical Hall element outputs a Hall voltage generated by a Hall effect to detect the magnetic field. In such a vertical Hall element, a vertical Hall element has been proposed to be capable of obtaining good sensitivity by arranging an output electrode pair which outputs a Hall voltage at positions sandwiching a current on the surface of the substrate.

For example, a related art proposes a vertical Hall element in which an electrode separation diffusion layer (P well) for separating an electrode composed of an N-type diffusion layer and adjacent electrodes is provided on a magnetic sensing part (N well) formed on a P-type substrate, and there is a concentration distribution in which the impurity concentration of the magnetic sensing part has a highest concentration on the substrate surface and gradually decreases as the depth from the surface increases. In this vertical Hall element, a width of a depletion layer formed and a width of the electrode separation diffusion layer which becomes narrow as the depth increases from the substrate surface complement each other, expansion of the current in the magnetic sensing part is suppressed, the current component flowing in the direction perpendicular to the substrate can be relatively increased, and the sensitivity can be improved.

SUMMARY

A semiconductor device according to an embodiment of the present invention includes a semiconductor substrate of a first conductivity type, and a vertical Hall element provided on the semiconductor substrate. The vertical Hall element includes an impurity diffusion layer of a second conductivity type and three or more electrodes. The impurity diffusion layer is provided on the semiconductor substrate and has an impurity concentration which increases as a depth increases. The three or more electrodes are provided in a straight line on a surface of the impurity diffusion layer and are composed of an impurity region of the second conductivity type having a higher concentration than the impurity diffusion layer.

According to an aspect of the present invention, it is possible to provide a semiconductor device including a vertical Hall element capable of improving sensitivity.

BRIEF DESCRIPTION OF THE DRAWINGS

FIG. 1A is a schematic plan view of the vertical Hall element. FIG. 1B is a schematic cross-sectional view taken along line I-I of FIG. 1A.

DESCRIPTION OF THE EMBODIMENTS

Figure 1A:
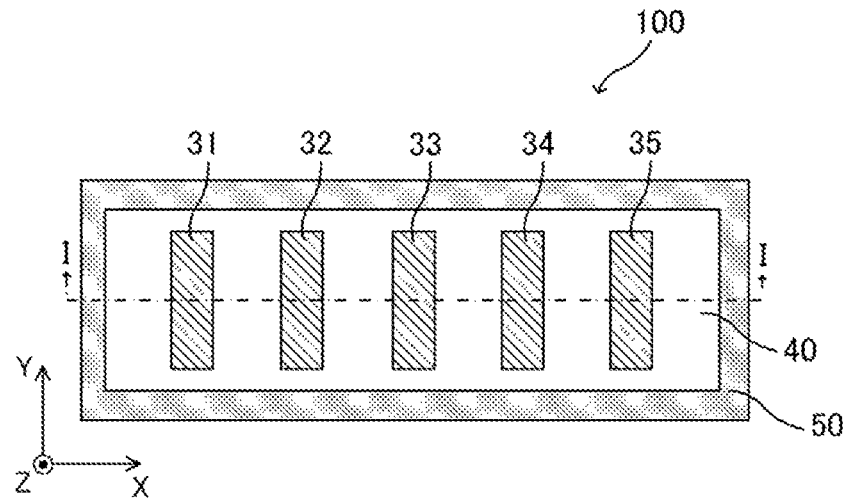
FIG. 1A and FIG. 1B are schematic views illustrating a semiconductor device including a vertical Hall element according to a first embodiment of the present invention.

A semiconductor device according to an embodiment of the present invention includes a semiconductor substrate of a first conductivity type, and a vertical Hall element provided on the semiconductor substrate. The vertical Hall element includes an impurity diffusion layer of a second conductivity type and three or more electrodes. The impurity diffusion layer is provided on the semiconductor substrate and has an impurity concentration which increases as a depth increases. The three or more electrodes are provided in a straight line on a surface of the impurity diffusion layer and are composed of an impurity region of the second conductivity type having a higher concentration than the impurity diffusion layer.

With a structure and an operating principle different from the vertical Hall element described in the related art above which detects a Hall voltage generated with respect to a drive current (hereinafter, the drive current may be simply referred to as a "current") flowing in a direction perpendicular to the substrate, this vertical Hall element detects a Hall voltage generated with respect to a current flowing in a direction parallel to the substrate. Specifically, this vertical Hall element passes a current by causing a potential difference between two electrodes at positions sandwiching at least one electrode among the three or more electrodes provided in a straight line on the surface of the impurity diffusion layer. Then, when a magnetic field is applied to charged particles of a current flowing in a direction parallel to the substrate from a direction parallel to the substrate and a direction orthogonal to the direction in which the current flows, this vertical Hall element can output a Hall voltage from the electrode sandwiched between these two electrodes. In such a vertical Hall element, if a resistivity of the current path between the two electrodes is constant, as the path becomes longer, a resistance value in the path increases, and it becomes difficult for the current path to expand in the depth direction. Then, since the plane of the current flowing in the direction parallel to the substrate becomes narrow, it becomes difficult to obtain the Hall effect and the sensitivity is lowered.

Therefore, in the vertical Hall element of the present embodiment, the impurity concentration of the impurity diffusion layer serving as the current path increases as the depth increases. Accordingly, since the resistance value in the path does not increase even if the current path becomes deeper, with the current path expanding in the depth direction and the plane of the current flowing in the direction parallel to the substrate being widened, it becomes easy to receive a magnetic field and the sensitivity can be improved.

Hereinafter, embodiments for implementing the present invention will be described in detail with reference to the drawings.

In the drawings, the same components may be labeled with the same reference numerals, and repeated descriptions may be omitted. Further, in the drawings, an X direction, a Y direction, and a Z direction are orthogonal to each other. The direction including the X direction and a direction (−X direction) opposite to the X direction will be referred to as an "X-axis direction"; the direction including the Y direction and a direction (−Y direction) opposite to the Y direction will be referred to as a "Y-axis direction"; and the direction including the Z direction and a direction (−Z direction; depth direction) opposite to the Z direction will be referred to as a "Z-axis direction" (height direction; thickness direction). In this regard, in the following embodiments, a face of each film on a Z direction side may be referred to as a "surface".

The drawings are merely schematic, and ratios of widths, lengths, depths, etc. are not as illustrated in the drawings.

First Embodiment

Figure 1B:
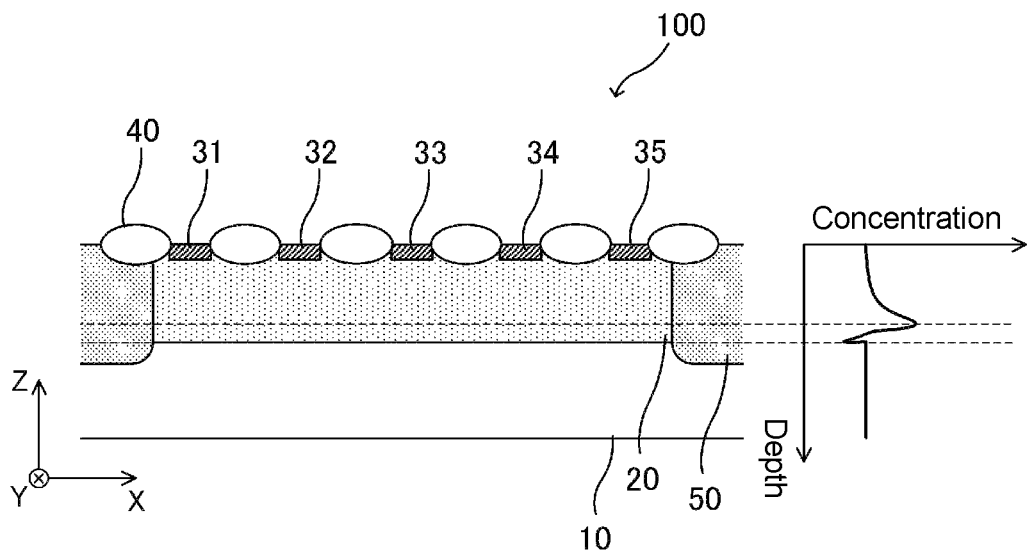

FIG. 1A and FIG. 1B are schematic views illustrating a semiconductor device including a vertical Hall element according to a first embodiment of the present invention. FIG. 1A is a schematic plan view of the vertical Hall element. FIG. 1B is a schematic cross-sectional view taken along line I-I of FIG. 1A.

As illustrated in FIG. 1A and FIG. 1B, the semiconductor device of the present embodiment includes a semiconductor substrate 10, a vertical Hall element 100 provided on the semiconductor substrate 10, and an element separation diffusion layer 50 provided to surround the periphery of the vertical Hall element 100. Further, the vertical Hall element 100 includes an impurity diffusion layer 20, electrodes 31 to 35, and an insulating film 40.

The semiconductor substrate 10 is a silicon wafer to which an impurity of a P-type, which is a first conductivity type, is added.

The impurity concentration of the semiconductor substrate 10 is not particularly limited and may be appropriately selected depending on the intended purpose. However, from the viewpoint of suppressing the expansion of a depletion layer to the impurity diffusion layer 20, the impurity concentration of the semiconductor substrate 10 may be lower than the impurity concentration at the interface between the impurity diffusion layer 20 and the semiconductor substrate 10 and, if the above range can be satisfied, may be in a range of $5 \times 10^{14}$ atoms/cm$^3$ or more and $5 \times 10^{15}$ atoms/cm$^3$ or less, for example.

The thickness of the semiconductor substrate 10 is not particularly limited and may be appropriately selected depending on the intended purpose. However, from the viewpoint of reducing the stress applied to the vertical Hall element 100 provided on the surface, the thickness of the semiconductor substrate 10 may be 100 μm or more, and from the viewpoint of reducing the height of the product, the thickness of the semiconductor substrate 10 may be 400 μm or less.

The impurity diffusion layer 20 which is a magneto-sensitive part is provided on the semiconductor substrate 10, and an impurity of an N-type, which is a second conductivity type, is injected and diffused in the impurity diffusion layer 20.

The impurity concentration of the impurity diffusion layer 20 is set to increase as the depth increases and has a peak concentration. In other words, the resistivity of the impurity diffusion layer 20 decreases as the depth increases until a depth (which may hereinafter be referred to as a "peak concentration depth"; the "depth" refers to a depth from the surface of the impurity diffusion layer 20) having the peak concentration, and increases as the depth increases after exceeding the peak concentration depth. Therefore, the current path expands easily until the peak concentration depth, and hardly expands to a location deeper than the peak concentration depth.

Based on these, regarding the impurity concentration of the impurity diffusion layer 20, by adjusting the peak concentration depth and setting a concentration gradient of the impurity so that the resistance value of the deepest current path becomes similar to the resistance value of the current path passing through a location shallower than the peak concentration depth, it is possible to expand the current path in a well-balanced manner.

The peak concentration of the impurity diffusion layer 20 is not particularly limited and may be appropriately selected depending on the intended purpose. However, the peak concentration of the impurity diffusion layer 20 may enable expansion of the current path in a well-balanced manner and, specifically, may be in a range of $1 \times 10^{16}$ atoms/cm$^3$ or more and $1 \times 10^{17}$ atoms/cm$^3$ or less, for example.

From the viewpoint of suppressing the expansion of the depletion layer to the impurity diffusion layer 20, the impurity concentration at the interface between the impurity diffusion layer 20 and the semiconductor substrate 10 may be in a range of the impurity concentration or higher of the semiconductor substrate 10 to the peak concentration or lower of the impurity diffusion layer 20 and, if the above range can be satisfied, may be in a range of $5 \times 10^{15}$ atoms/cm$^3$ or more and $1 \times 10^{17}$ atoms/cm$^3$ or less, for example.

The thickness of the impurity diffusion layer 20 is not particularly limited and may be appropriately selected depending on the intended purpose, but may be in a range of 3 μm or more and 15 μm or less, for example.

The five electrodes 31 to 35 are provided in a straight line on the surface of the impurity diffusion layer 20, and are composed of an N-type impurity region having a higher concentration than the impurity diffusion layer 20.

The impurity concentration of the electrodes 31 to 35 is not particularly limited and may be appropriately selected depending on the intended purpose, but from the viewpoint of conductivity, may be $1 \times 10^{19}$ atoms/cm$^3$ or more, for example.

The electrodes 31 to 35 may be either drive current supply electrodes or Hall voltage output electrodes. When an operation of detecting a magnetic field is performed in the present embodiment, the electrodes 31, 33, and 35 serve as drive current supply electrodes, and the electrodes 32 and 34 serve as Hall voltage output electrodes. Further, to acquire output voltages Vout1 to Vout4 required in the case of removing an offset voltage according to a spinning current method to be described later, the drive current supply electrodes and the Hall voltage output electrodes may be exchanged.

The insulating film 40 is provided on the surface of the impurity diffusion layer 20 around the electrodes 31 to 35.

The insulating film 40 may not have a conductivity type, for example, considering that if it is an element having a conductivity type such as a P-type electrode separation diffusion layer, a depletion layer may be formed near the surface.

The insulating film 40 of the present embodiment is a silicon oxide film formed according to the LOCOS (local oxidation of silicon) method.

The P-type element separation diffusion layer 50 surrounds the vertical Hall element 100 to cover the side surface of the impurity diffusion layer 20, and is formed deeper than the impurity diffusion layer 20. Accordingly, the vertical Hall element 100 is electrically separated from other regions (not illustrated) on the semiconductor substrate 10 around it.

In other regions (not illustrated) on the semiconductor substrate 10 electrically separated from the vertical Hall element 100 by the element separation diffusion layer 50, an element such as a transistor constituting at least any of a circuit for processing an output signal from the vertical Hall element 100 and a circuit for supplying a signal to the vertical Hall element 100 is provided.

Next, a method of manufacturing the vertical Hall element according to the first embodiment will be described.

First, after injecting an N-type impurity from the surface of the semiconductor substrate 10, an epitaxial layer in which an N-type impurity is added and the impurity concentration is kept constant is deposited on the surface of the semiconductor substrate 10. At this time, the peak concentration of the impurity injected from the surface of the semiconductor substrate 10 is set to be higher than the impurity concentration of the epitaxial layer.

The injection of the impurity from the surface of the semiconductor substrate 10 may be performed using a high-energy ion implanter capable of injecting an impurity at an energy of about 3 KeV to 3 MeV to increase the impurity concentration.

Next, the impurity injected into the surface of the semiconductor substrate 10 is diffused to both the semiconductor substrate 10 and the epitaxial layer to form the impurity diffusion layer 20.

Then, using the insulating film 40 formed on the surface of the impurity diffusion layer 20 according to the LOCOS (local oxidation of silicon) method as a mask, the N-type impurity is injected from the surface of the impurity diffusion layer 20 to have a high concentration to form the electrodes 31 to 35.

By forming the vertical Hall element 100 in this manner, as illustrated on the right side of FIG. 1B, a concentration profile of the impurity contained in the semiconductor substrate 10 and the impurity diffusion layer 20 can be obtained. As illustrated in this concentration profile, the impurity diffusion layer 20 has a peak concentration in which the concentration of the N-type impurity increases as the depth increases. Further, in the impurity diffusion layer 20, the impurity concentration decreases as the depth increases from the peak concentration depth.

Next, the principle of detecting a magnetic field component in a direction parallel to the semiconductor substrate 10 in the vertical Hall element 100 included in the semiconductor device of the present embodiment will be described with reference to FIG. 2.

Figure 2:
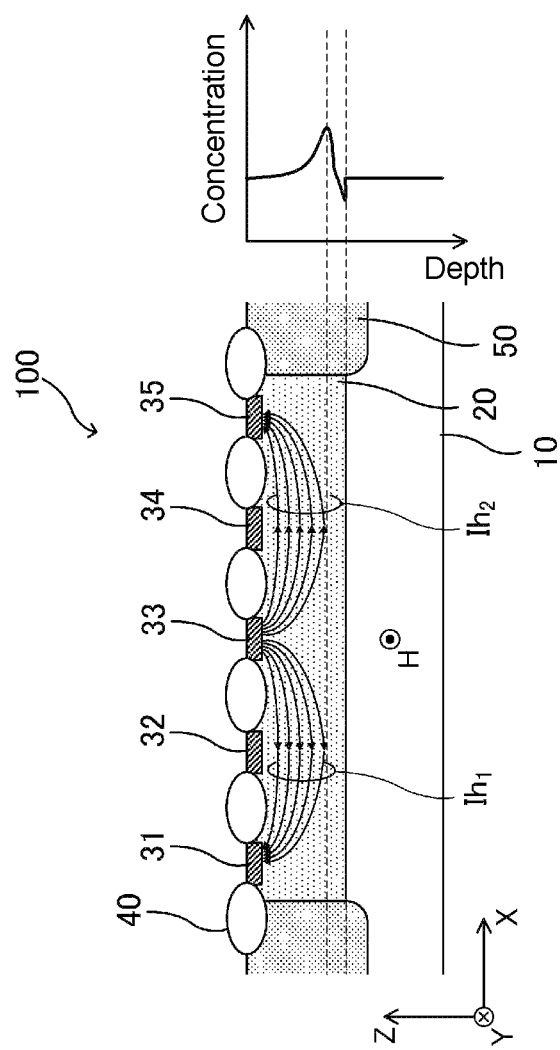
FIG. 2 is a view illustrating an operating principle of the vertical Hall element according to the first embodiment.

FIG. 2 is a view illustrating an operating principle of the vertical Hall element according to the first embodiment. FIG. 2 schematically illustrates how drive currents respectively flow from the electrode 33 to the electrodes 31 and 35 in the +X direction and the −X direction.

As illustrated in FIG. 2, when a voltage is applied so as to pass a current from the electrode 33 located at the center among the electrodes 31 to 35 respectively to the electrodes 31 and 35 located at two ends, as illustrated by currents $Ih_1$ and $Ih_2$, the current also flows inside the impurity diffusion layer 20. The depth of this current path varies depending on the resistance value in the path. That is, in the impurity diffusion layer 20 on which the electrodes 31 to 35 are formed, since the concentration distribution of the impurity increases and the resistance value decreases as the depth increases, the current path extends to the peak concentration depth of the impurity diffusion layer 20 even though the length of the current path increases.

When a magnetic field H is applied in the −Y direction to each of the currents $Ih_1$ and $Ih_2$ flowing in this manner, with a Lorentz force being generated respectively in the +Z direction for charged particles of the current $Ih_1$ and in the −Z direction for charged particles of the current $Ih_2$, Hall voltages which are potential differences of opposite signs are generated. By outputting a voltage between the electrode 32 and the electrode 34 by adding absolute values of these potential differences, the vertical Hall element 100 can detect the magnetic field H applied from the −Y direction with high sensitivity.

Further, if the impurity concentration of the N-type impurity diffusion layer 20 is equal to or higher than the impurity concentration of the semiconductor substrate 10 in the vicinity of the interface with the P-type semiconductor substrate 10 in contact with the lower surface, a depletion layer formed at the interface between the impurity diffusion layer 20 and the semiconductor substrate 10 is less likely to expand to the impurity diffusion layer 20. Therefore, in the vicinity of the interface between the impurity diffusion layer 20 and the semiconductor substrate 10, the impurity concentration of the impurity diffusion layer 20 is set to be equal to or higher than the impurity concentration of the semiconductor substrate 10 to make it difficult for the depletion layer to expand to the impurity diffusion layer 20 and to prevent the expansion of the depletion layer from reaching the peak concentration depth. Accordingly, even if the applied voltage is increased to pass a larger current and increase the sensitivity, the current paths of the currents $Ih_1$ and $Ih_2$ do not significantly change due to the generated depletion layer, and the magnetic field can be detected stably.

Since the five electrodes 31 to 35 have high structural symmetry as they are provided in a straight line on the surface of the impurity diffusion layer 20, an outputted offset voltage can be reduced even when no magnetic field is applied, and the reduced offset voltage can be effectively removed according to the following spinning current method.

Herein, a method of removing the offset voltage of the vertical Hall element 100 according to the spinning current method will be described with reference to FIG. 1A and FIG. 1B.

First, using the electrodes 31, 33, and 35 as the drive current supply electrodes, currents are passed from the electrode 33 to the electrodes 31 and 35, and using the electrodes 32 and 34 as the Hall voltage output electrodes, a voltage between the electrodes 32 and 34 is obtained as an output voltage Vout1. Further, reversing the direction of passing the current, currents are passed from the electrodes 31 and 35 to the electrode 33, and a voltage between the electrodes 32 and 34 is obtained as an output voltage Vout2.

Further, exchanging the drive current supply electrodes and the Hall voltage output electrodes, a current is passed from the electrode 32 to the electrode 34, and a voltage between the electrode 33 and the electrodes 31 and 35 is obtained as an output voltage Vout3. Further, reversing the direction of passing the current, a current is passed from the electrode 34 to the electrode 32, and a voltage between the electrode 33 and the electrodes 31 and 35 is obtained as an output voltage Vout4.

Then, by adding or subtracting these output voltages Vout1 to Vout4, the offset voltage can be removed.

Accordingly, in the spinning current method, the electrodes arranged in a straight line may be used as if the drive current supply electrodes and the Hall voltage output electrodes are alternately arranged by switching, and the direction of passing the current is appropriately switched, and by exchanging the roles of the drive current supply electrodes and the Hall voltage output electrodes, the offset voltage can be removed.

In such a spinning current method, the offset voltage due to structural symmetry can be removed, but since the offset voltage in the case where the current path changes due to the expansion of the depletion layer cannot be removed, in the vertical Hall element 100, the expansion of the depletion layer is prevented from reaching the peak concentration depth.

Further, although the spinning current method in the case where the number of electrodes is five has been described above, the spinning current method is not limited thereto and may be implemented if there are five or more electrodes.

Modification Example of First Embodiment

Figure 3:
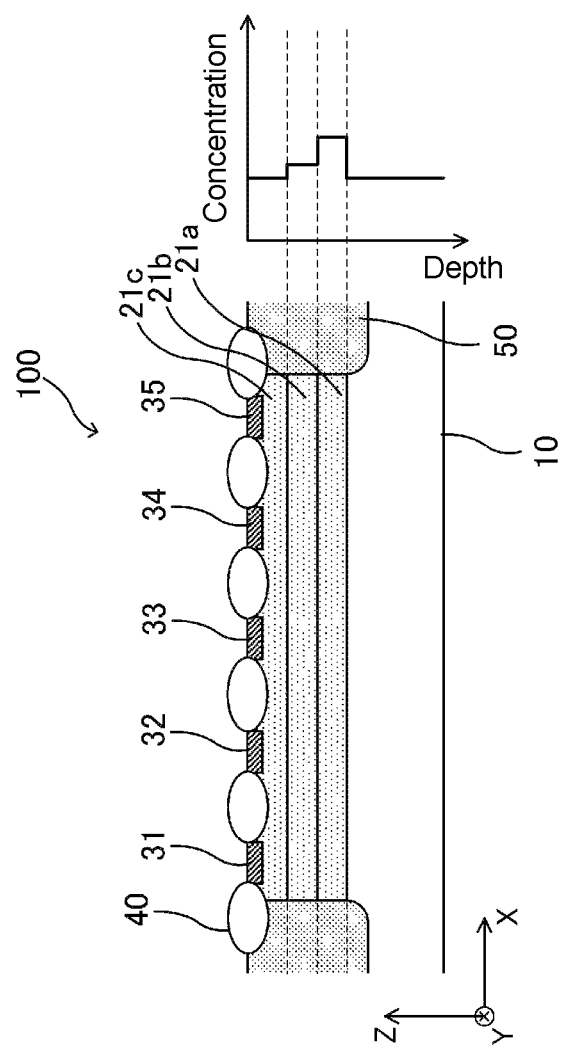
FIG. 3 is a schematic cross-sectional view illustrating a vertical Hall element which is a modification example of the first embodiment.

FIG. 3 is a schematic cross-sectional view illustrating a vertical Hall element which is a modification example of the first embodiment.

As illustrated in FIG. 3, the modification example of the first embodiment is similar to the first embodiment except that, in the modification example of the first embodiment, the impurity diffusion layer 20 of the first embodiment is configured as a three-layer structure of epitaxial layers 21a, 21b, and 21c respectively having different impurity concentrations.

As a method of manufacturing a vertical Hall element according to the modification example of the first embodiment, instead of forming the impurity diffusion layer 20, an epitaxial layer 21a in which an N-type impurity is added and the impurity concentration is kept constant is deposited on the surface of the semiconductor substrate 10, and while reducing the amount of added impurity, epitaxial layers 21b and 21c are sequentially deposited on the epitaxial layer 21a.

Accordingly, in the modification example of the first embodiment, since there is no step of diffusing impurity as in the first embodiment and variation in the impurity concentration can be suppressed as compared with the first embodiment, the offset voltage can be reduced.

Second Embodiment

Figure 4:
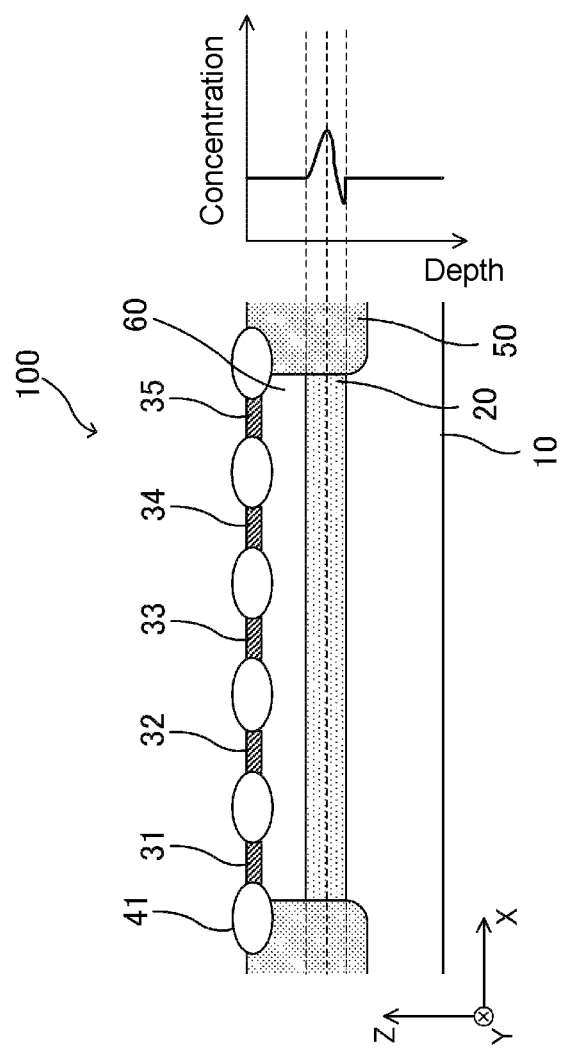
FIG. 4 is a schematic cross-sectional view illustrating an operating principle of a vertical Hall element according to a second embodiment.

FIG. 4 is a schematic cross-sectional view illustrating an operating principle of a vertical Hall element according to a second embodiment.

As illustrated in FIG. 4, the second embodiment is similar to the first embodiment except that, in the second embodiment, an upper part of the impurity diffusion layer 20 of the first embodiment is configured as a semiconductor layer 60 having a constant impurity concentration, and the insulating film 40 is configured as an insulating film 41 having a bottom located deeper than the bottom surfaces of the electrodes 31 to 35 with respect to the surface of the impurity diffusion layer 20.

In the method of manufacturing the vertical Hall element 100 of the first embodiment, the semiconductor layer 60 is an epitaxial layer having a constant impurity concentration and is a region at a depth to which the impurity injected into the semiconductor substrate 10 is not diffused. In other words, when the semiconductor layer 60 is regarded as a part of the impurity diffusion layer 20, the impurity diffusion layer 20 has a configuration in which the impurity concentration increases as the depth increases from a predetermined depth.

Accordingly, in the second embodiment, since the impurity injected into the semiconductor substrate 10 may not diffuse as compared with the first embodiment, production becomes easier, and it is possible to suppress variation in the impurity concentration due to diffusion.

The impurity concentration of the semiconductor layer 60 is not particularly limited and may be appropriately selected depending on the intended purpose. However, the impurity concentration of the semiconductor layer 60 may be in a range which enables expansion of the current path in a well-balanced manner and, for example, may be $1 \times 10^{15}$ atoms/cm$^3$ or more and $5 \times 10^{16}$ atoms/cm$^3$ or less.

The thickness of the semiconductor layer 60 is not particularly limited and may be appropriately selected depending on the intended purpose. However, the thickness of the semiconductor layer 60 may be in a thick range in a range which enables expansion of the current path in a well-balanced manner and for example, may be a thick range in a range of 6 μm or more and 15 μm or less.

The insulating film 41 is formed deeper than the depths of the electrodes 31 to 35.

Accordingly, it is possible to suppress a current flowing at a shortest distance in a direction (X-axis direction) parallel to the semiconductor substrate 10 between the electrodes 31 to 35 provided on the surface of the semiconductor layer 60, and induce a current to flow in a depth direction (−Z direction).

The depth of the insulating film 41 is not particularly limited and may be appropriately selected depending on the intended purpose, as long as a current can be induced to flow in the depth direction (−Z direction).

In the present embodiment, the depths of the electrodes 31 to 35 are 0.1 μm, and the depth of the insulating film 41 is 0.3 μm.

As described above, in the second embodiment, the upper part of the impurity diffusion layer 20 of the first embodiment is configured as the semiconductor layer 60 having a constant impurity concentration, and the insulating film 40 of the first embodiment is configured as the insulating film 41 having a depth greater than the depths of the electrodes 31 to 35.

Accordingly, in the second embodiment, since the impurity injected into the semiconductor substrate 10 may not be diffused as compared with the first embodiment, production becomes easier, and it is possible to suppress variation in the impurity concentration due to diffusion. Further, with the insulating film 41, it is possible to suppress a current flowing at the shortest distance in the X-axis direction between the electrodes 31 to 35 and induce a current to flow in the −Z direction.

As described above, a semiconductor device according to an embodiment of the present invention includes a semiconductor substrate of a first conductivity type, and a vertical Hall element provided on the semiconductor substrate. The vertical Hall element includes an impurity diffusion layer of a second conductivity type and three or more electrodes. The impurity diffusion layer is provided on the semiconductor substrate and has an impurity concentration which increases as a depth increases. The three or more electrodes are provided in a straight line on a surface of the impurity diffusion layer and are composed of an impurity region of the second conductivity type having a higher concentration than the impurity diffusion layer.

Accordingly, it is possible to provide a semiconductor device including a vertical Hall element capable of improving sensitivity.

Although the embodiments of the present invention have been described above, obviously the present invention is not limited to the above embodiments and various modifications may be made without departing from the spirit of the present invention.

For example, although the first conductivity type has been described as the P-type and the second conductivity type has been described as the N-type, the conductivity types may be exchanged, and the first conductivity type may be the N-type and the second conductivity type may be the P-type.

Further, in each of the above embodiments, the number of electrodes is five, but if the offset voltage can be tolerated or can be reduced to an extent that it is not necessary to remove the offset voltage according to the spinning current method, it may suffice to have three electrodes, including at least two drive current supply electrodes and one Hall voltage output electrode. In other words, by adopting an embodiment in which the electrodes 34 and 35 of the vertical Hall element 100 illustrated in FIG. 2 are not formed and detecting the magnetic field H simply by the current $Ih_1$, since the layout area can be narrowed, the vertical Hall element can be downsized.

What is claimed is:

1. A semiconductor device comprising:
   a semiconductor substrate of a first conductivity type; and
   a vertical Hall element provided on the semiconductor substrate,
   wherein the vertical Hall element comprises:
   an impurity diffusion layer of a second conductivity type, provided on the semiconductor substrate and having an impurity concentration which increases as a depth increases, wherein the impurity concentration at an interface between the impurity diffusion layer and the semiconductor substrate is equal to or higher than an impurity concentration of the semiconductor substrate; and
   three or more electrodes provided in a straight line directly on a surface of the impurity diffusion layer and composed of an impurity region of the second conductivity type having a higher concentration than that of the impurity diffusion layer,
   wherein the impurity concentration of the impurity diffusion layer has a constant concentration in an upper part of the impurity diffusion layer and increases as the depth increases from a predetermined depth.

2. The semiconductor device according to claim 1, wherein the impurity concentration of the impurity diffusion layer has a peak concentration and decreases as the depth increases from a depth having the peak concentration.

3. The semiconductor device according to claim 1, further comprising an insulating film provided around the electrodes at the surface of the impurity diffusion layer and having a bottom located deeper than bottom surfaces of the electrodes with respect to the surface.

4. The semiconductor device according to claim 1, wherein the electrodes provided in a straight line on the surface of the impurity diffusion layer are three electrodes,
   a drive current is passed between the electrodes located at two ends, and
   a Hall voltage is detected by the electrode located at a center.

5. The semiconductor device according to claim 1, wherein the electrodes provided in a straight line on the surface of the impurity diffusion layer are five electrodes,
   a drive current is passed from the electrode located at a center toward the electrodes located at two ends, and
   a Hall voltage between two electrodes located between the electrode located at the center and the electrodes located at the two ends is detected.

* * * * *